United States Patent
Hébert et al.

(10) Patent No.: US 8,497,160 B2
(45) Date of Patent: Jul. 30, 2013

(54) METHOD FOR MAKING SOLDER-TOP ENHANCED SEMICONDUCTOR DEVICE OF LOW PARASITIC PACKAGING IMPEDANCE

(75) Inventors: François Hébert, San Mateo, CA (US); Anup Bhalla, Santa Clara, CA (US); Kai Liu, Mountain View, CA (US); Ming Sun, Sunnyvale, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 13/560,786

(22) Filed: Jul. 27, 2012

(65) Prior Publication Data

US 2012/0289001 A1 Nov. 15, 2012

Related U.S. Application Data

(62) Division of application No. 11/932,845, filed on Oct. 31, 2007, now Pat. No. 8,264,084.

(51) Int. Cl.
*H01L 21/60* (2006.01)

(52) U.S. Cl.
USPC ........... 438/113; 257/666; 257/673; 257/772; 257/E21.506; 257/E23.032; 438/613

(58) Field of Classification Search
USPC ................. 257/666, 673, 762, 772, 779, 784, 257/E21.506, E23.023; 438/113, 613
See application file for complete search history.

(56) References Cited

U.S. PATENT DOCUMENTS

2002/0084516 A1 * 7/2002 Efland et al. .................. 257/666

* cited by examiner

*Primary Examiner* — Lynne Gurley
*Assistant Examiner* — Vernon P Webb
(74) *Attorney, Agent, or Firm* — Chein-Hwa Tsao; CH Emily LLC

(57) ABSTRACT

A solder-top enhanced semiconductor device is proposed for packaging. The solder-top device includes a device die with a top metal layer patterned into contact zones and contact enhancement zones. At least one contact zone is electrically connected to at least one contact enhancement zone. Atop each contact enhancement zone is a solder layer for an increased composite thickness thus lowered parasitic impedance. Where the top metal material can not form a uniform good electrical bond with the solder material, the device die further includes an intermediary layer sandwiched between and forming a uniform electrical bond with the top metal layer and the solder layer. A method for making the solder-top device includes lithographically patterning the top metal layer into the contact zones and the contact enhancement zones; then forming a solder layer atop each of the contact enhancement zones using a stencil process for an increased composite thickness.

14 Claims, 10 Drawing Sheets

Present Invention Standard VDMOS

Fig. 3B Prior Art Section 2-2

Fig. 3C Prior Art Section 3-3

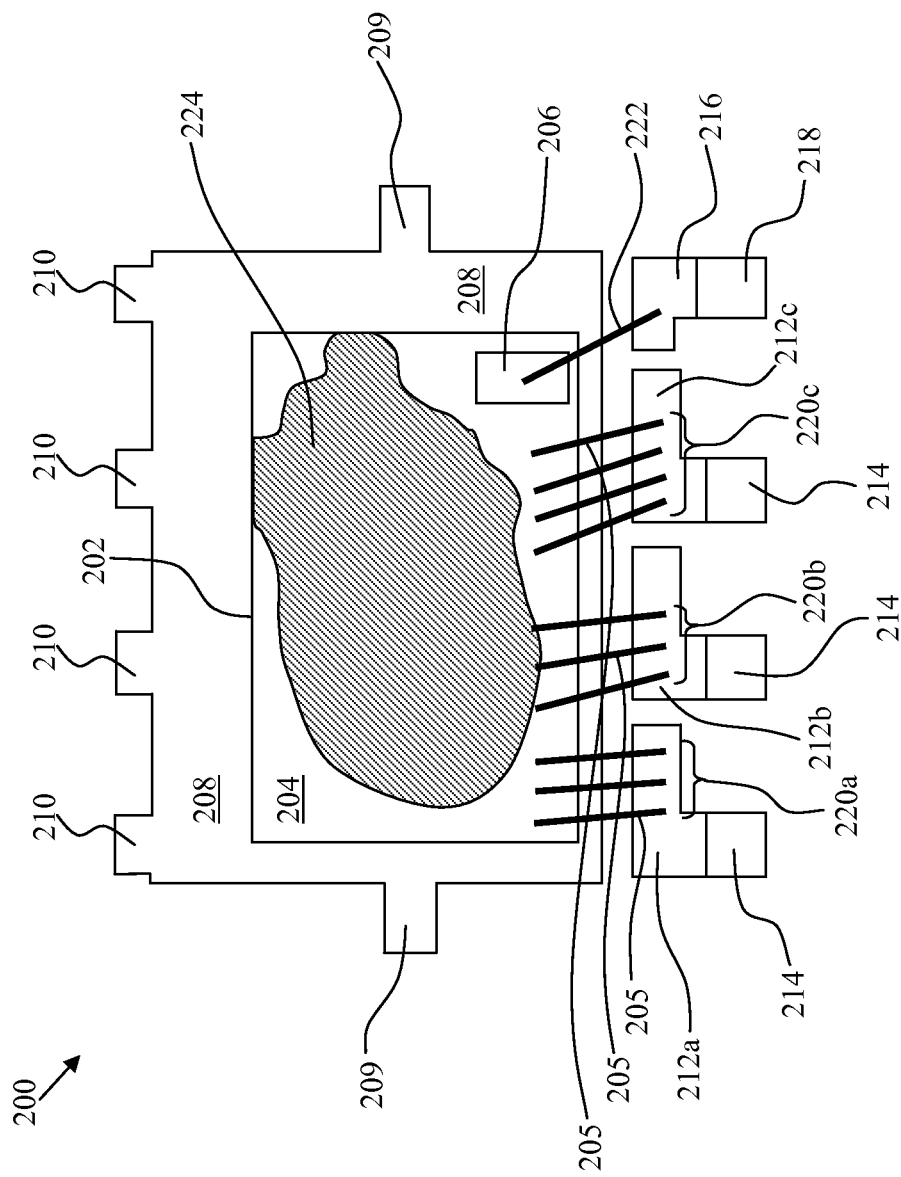
Fig. 4 Present Invention (raw concept)

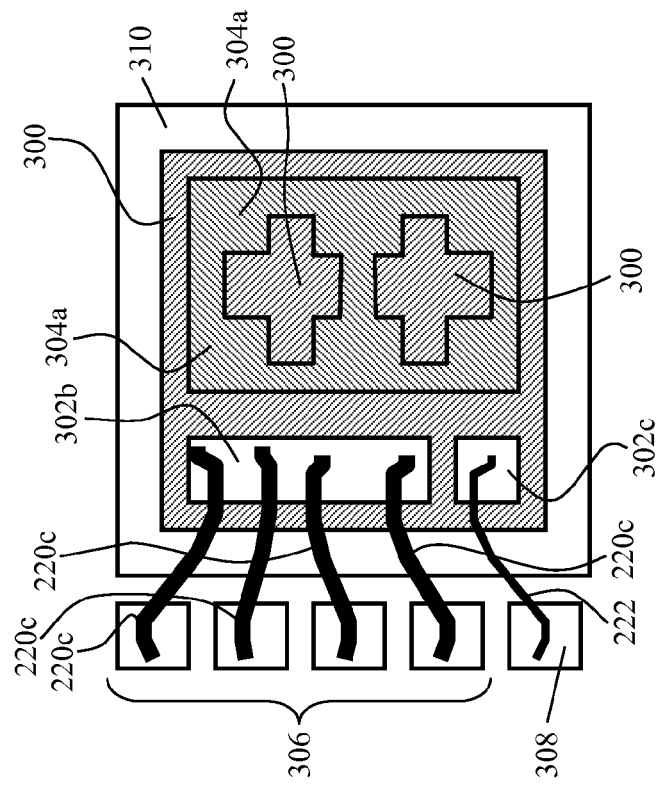
Fig. 5B Present Invention Standard VDMOS
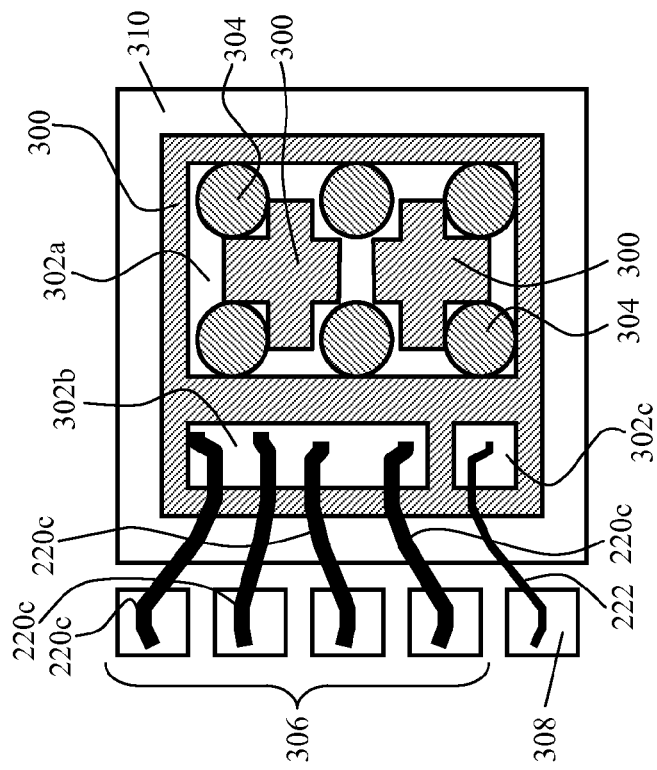
Fig. 5A Present Invention Standard VDMOS

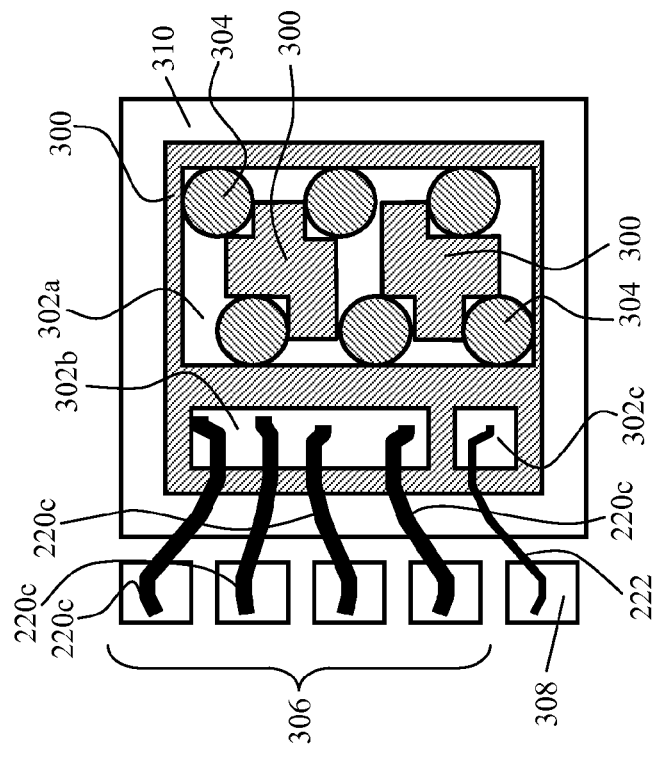
Fig. 7 Present Invention Standard VDMOS
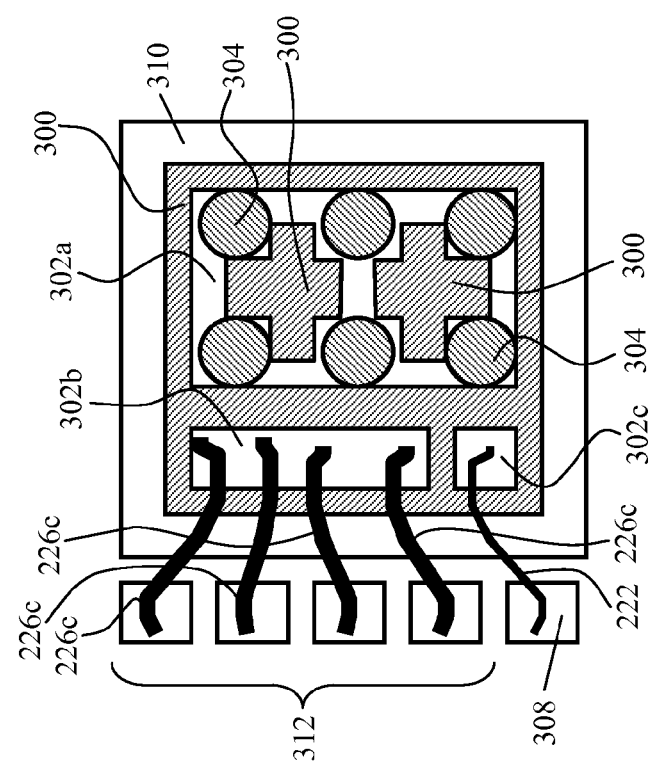
Fig. 6 Present Invention Bottom-Source LDMOS

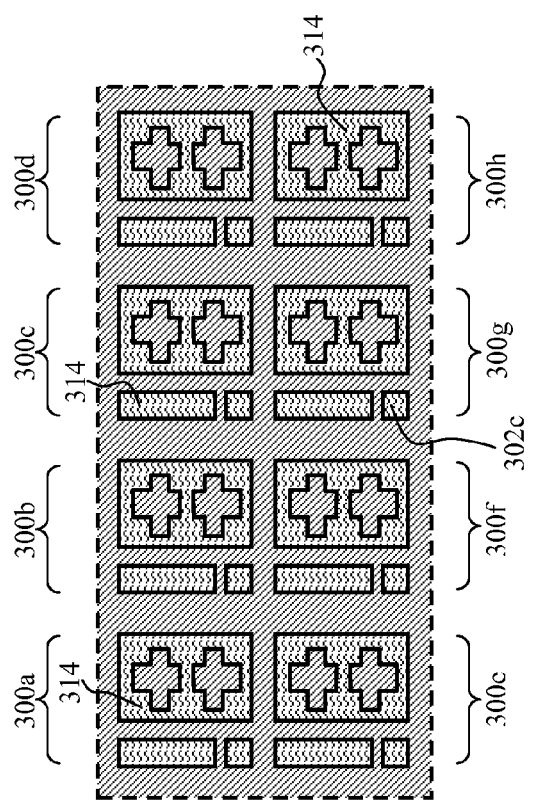
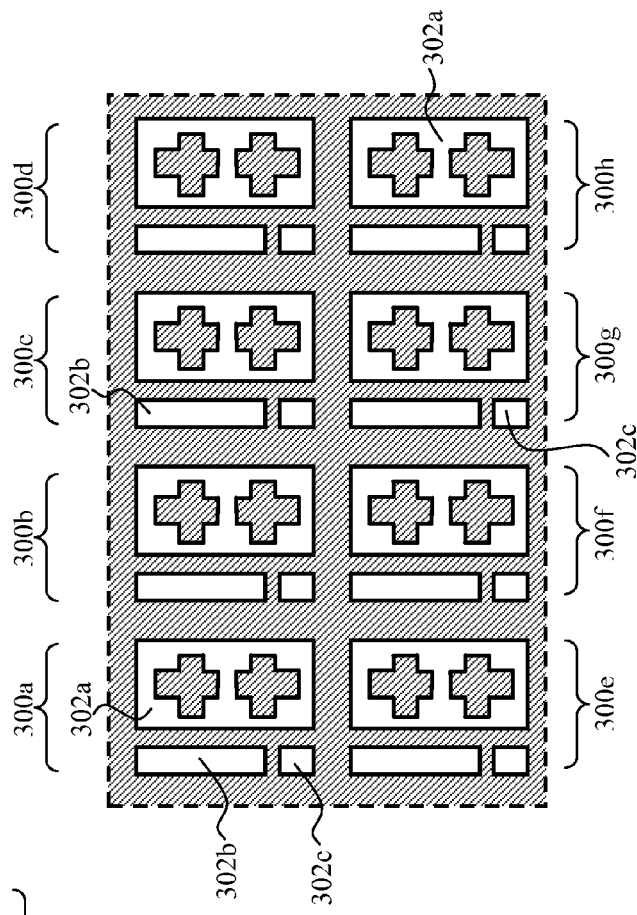

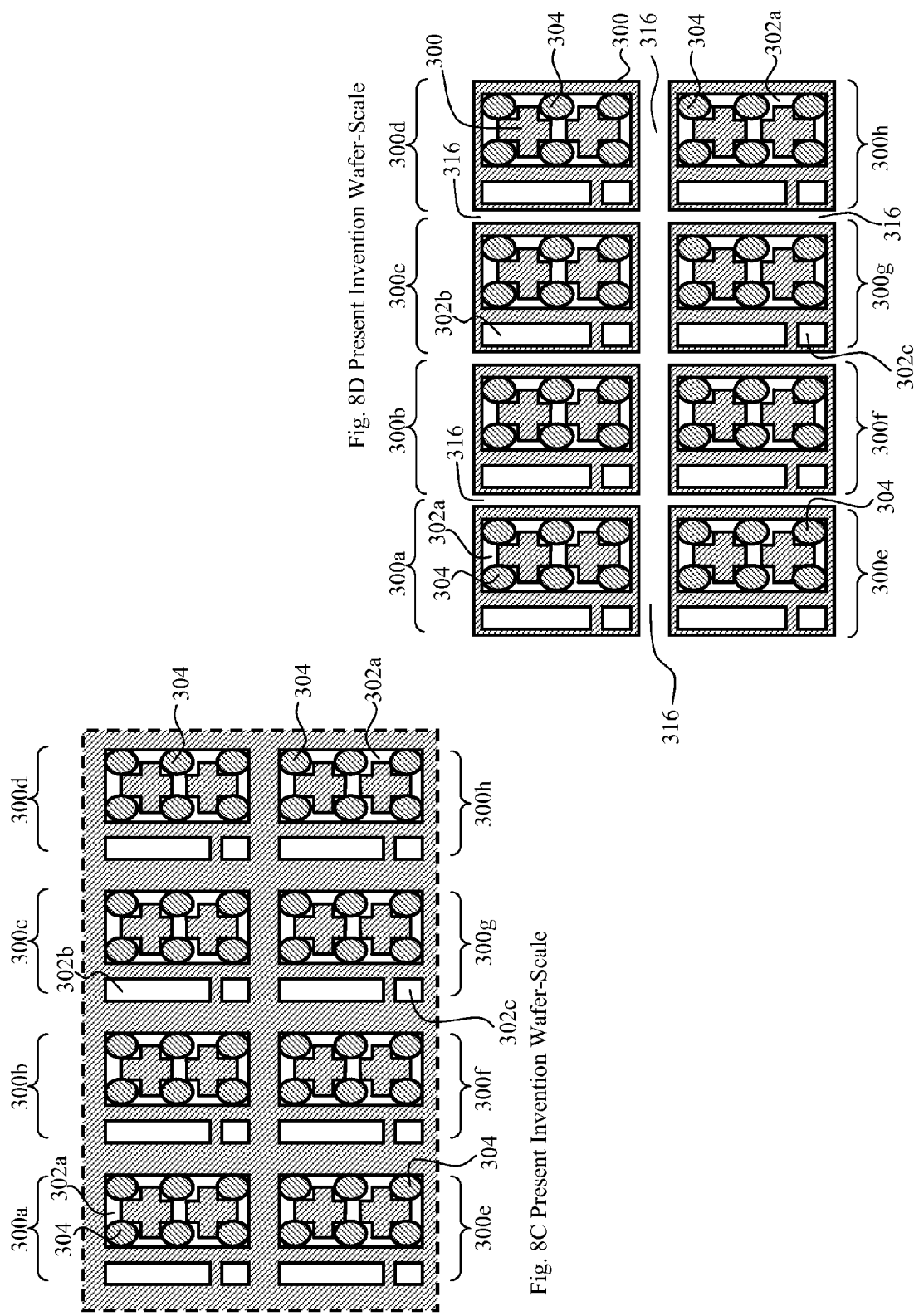

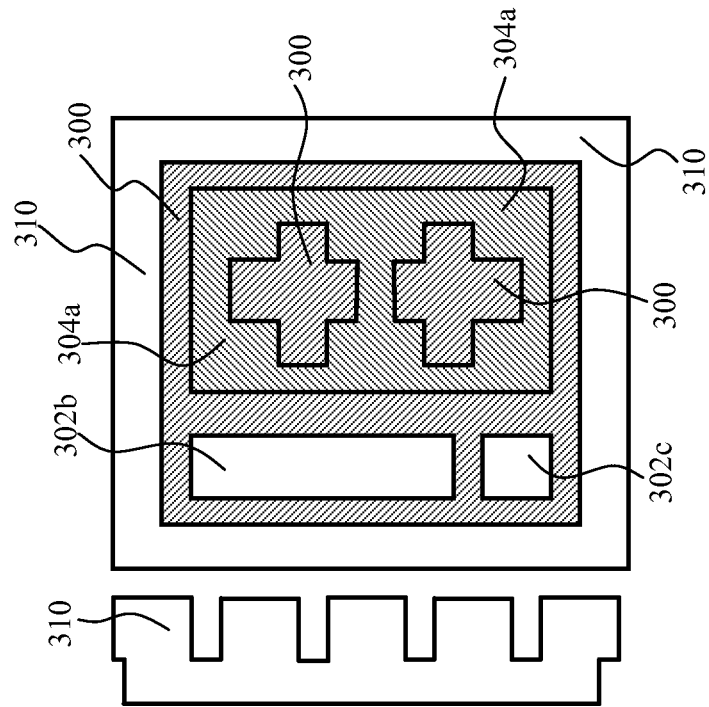
Fig. 8F Present Invention
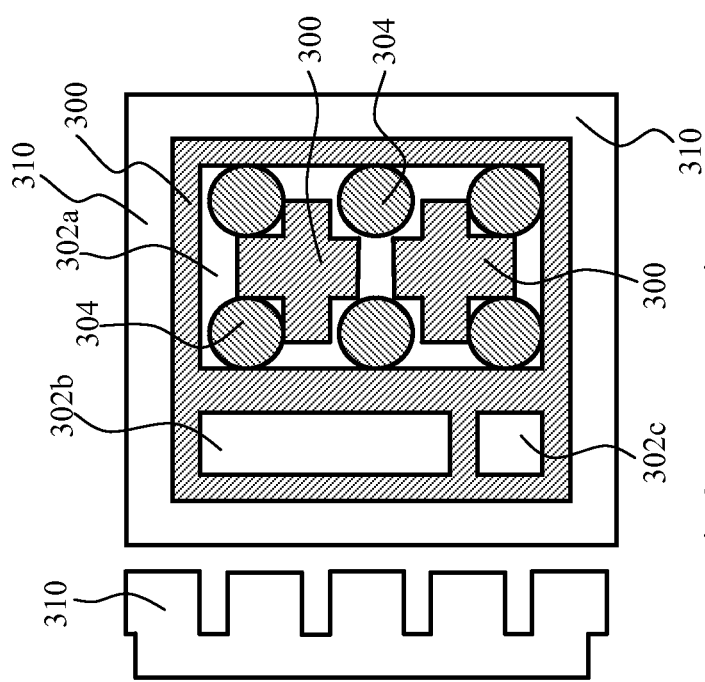
Fig. 8E Present Invention

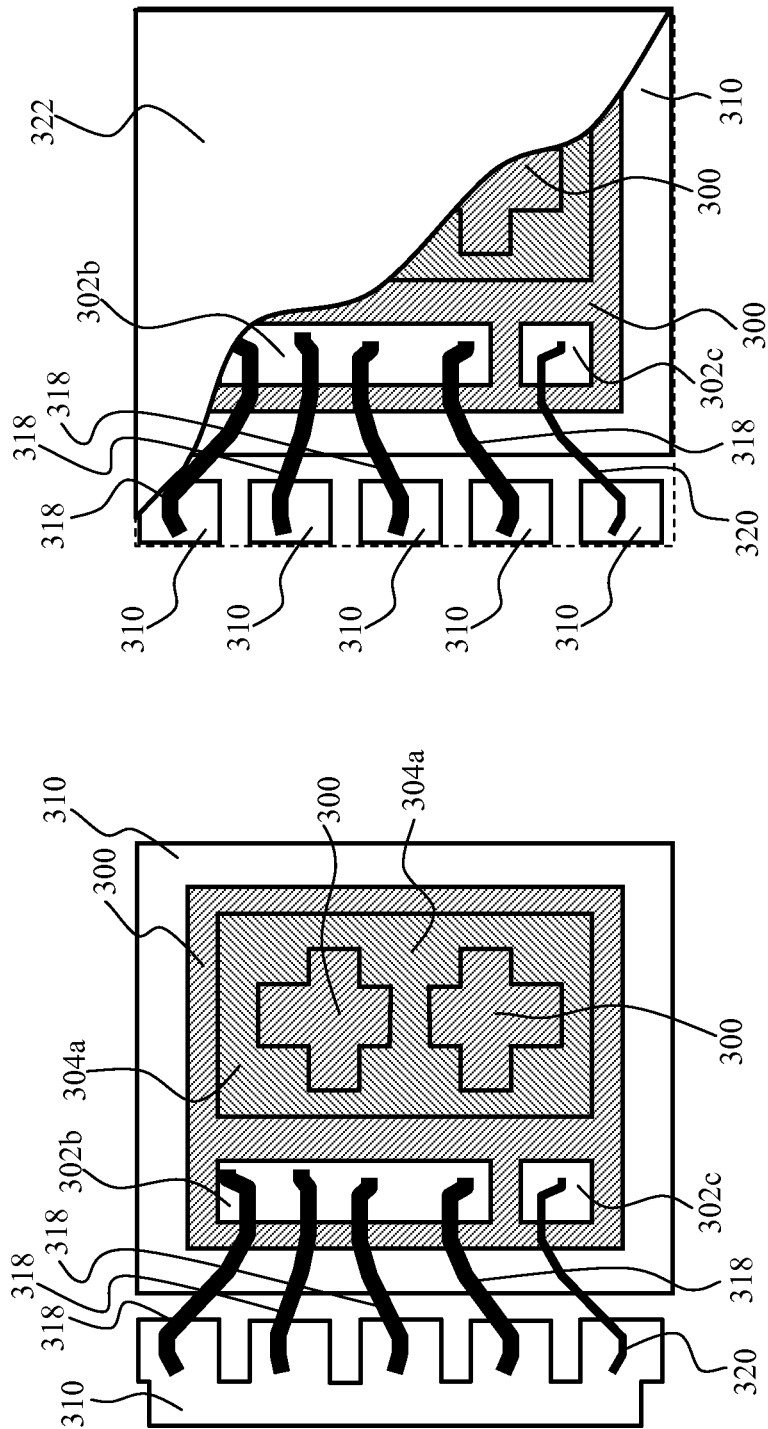

US 8,497,160 B2

METHOD FOR MAKING SOLDER-TOP ENHANCED SEMICONDUCTOR DEVICE OF LOW PARASITIC PACKAGING IMPEDANCE

CROSS REFERENCE TO RELATED APPLICATIONS

This application is a divisional application of a pending US patent application entitled "Solder-top Enhanced Semiconductor Device for Low Parasitic Impedance Packaging" by Francois Hebert et al with application Ser. No. 11/932,845 and filing date of Oct. 31, 2007 now U.S. Pat. No. 8,264,084 whose content is hereby incorporated by reference for all purposes.

Additionally, the following US patent documents:

- U.S. Pat. No. 6,841,852 by Luo et al, entitled "Integrated circuit package for semiconductor devices with improved electric resistance and inductance";
- U.S. application Ser. No. 11/226,913 by Ho at al, entitled "Semiconductor package having plate interconnections"; and
- U.S. application Ser. No. 11/544,453 by Sun et al, entitled "High Current Semiconductor Power Device SOIC Package"

are related to the subject matter of the present invention and are incorporated herein by reference for any and all purposes.

FIELD OF INVENTION

This invention relates generally to the field of electronic packaging. More specifically, the present invention is directed to the packaging of power semiconductor devices.

BACKGROUND OF THE INVENTION

A general trend of modern day electronic product, as demanded by the market place, is product miniaturization while maintaining its functionality and low cost. With no exception, the same trend also applies to the segment of power semiconductor devices. Here, reducing numerous parasitic impedances accompanying the device packaging environment can be very important as these parasitic impedances usually contribute to undesirable degradation of device performance such as reduced power conversion efficiency and/or increased noise emission from its associated power electronic circuits.

There were numerous prior arts directed to low-resistance, low-inductance power semiconductor device packaging. U.S. Pat. No. 6,841,852 by Luo et al, as illustrated in FIG. 1, described an integrated circuit IC package with a leadframe 108 that includes a leadframe pad 103a disposed under a die 100 and a bonding metal area 101a disposed over at least two adjacent sides of the die. An increase in the bonding metal area 101a increases the number of source bond wires 104 between the metal area 101a and the die 100 to reduce the parasitic electric resistance and inductance. Furthermore, the surface area of the external terminals radiating from the package's plastic body 106 is increased if not maximized so that heat can be dissipated quicker and external terminal resistances reduced. The IC die 100 is applicable for MOSFET devices and the bonding metal area 101a is used for the source terminal 101. The bonding metal area 101a may be implemented with a variety of shapes.

While, as shown, the use of multiple parallel short source bond wires 104 can somewhat reduce the parasitic impedance (in this case resistance and inductance), the use of short wires alone can still result in an overall higher parasitic impedance as the source current flow now tends to be limited by the on-die interconnections and, under standard foundry IC processes, the thickness of these on-die interconnections is typically very thin. Thicker on-die interconnections are expensive and may require non-standard foundry processes that are highly undesirable. On the other hand, limiting die size to achieve a correspondingly reduced parasitic impedance attributable to these on-die interconnections can end up lowering the overall device performance such as its power handling ability.

U.S. Pat. No. 5,767,567 by Hu et al, entitled "Design of device layout for integration with power MOSFET packaging to achieve better lead wire connections and lower on resistance" and as illustrated in FIG. 2, disclosed a MOSFET power IC device 100 formed in a semiconductor chip including numerous source contact areas 150-1, 150-2, 150-3, and 150-4 for connecting to a lead-frame 120 via numerous lead-wires 135, 160. The power IC device 100 includes many lead-wire contact points 170 on the source contact areas 150-1, 150-2, 150-3, and 150-4 for securely attaching the lead wires 160 onto the source contact areas. These lead-wire contact points 170 are uniformly distributed substantially over the source contact areas to reduce the spread resistance thus improving the device on-resistance and device performance.

As the deployment of uniformly distributed lead-wire contact points 170 substantially over the source contact areas 150-1, 150-2, 150-3, and 150-4 requires, for reaching distant regions of the source contact areas, using some long bond wires with correspondingly higher resistance and higher inductance, this approach still results in an overall higher parasitic impedance. On the other hand, limiting die size to achieve a correspondingly reduced parasitic impedance attributable to these long bond wires can end up lowering the overall device performance such as its power handling ability.

U.S. application Ser. No. 11/226,913 by Ho at al and U.S. application Ser. No. 11/544,453 by Sun et al disclosed semiconductor device package having plate interconnections. These are briefly shown in partial sectional perspective view in FIG. 3A, cross sectional view taken along line 2-2 in FIG. 3B and cross sectional view taken along line 3-3 in FIG. 3C. As shown in FIG. 3B, while the bottom of a power semiconductor die 120 is directly bonded to a drain contact portion 107 of leadframe, the top of the power semiconductor die 120 is connected to a source contact portion 110 of a leadframe with a patterned source plate 125 in lieu of bond wires. Likewise in FIG. 3C, while the bottom of the power semiconductor die 120 is directly bonded to a drain contact portion 107 of leadframe, the top of the power semiconductor die 120 is connected to a leadframe gate contact area 115 with a patterned gate plate 137, in lieu of bond wires, having a locking ball 155 mechanism for the patterned gate plate 137 to clip on thus further facilitate the packaging process. The encapsulant 135 just covers up all environmentally sensitive parts for long term device reliability.

The plate-connection package as disclosed above is a high-performance package as it is characterized by:
- lower cost since a single plate, instead of multiple bond wires, is used to connect regions;
- low parasitic resistance and inductance since device current is well distributed throughout the plate cross section; and
- high production through put since a matrix type clip attachment can be devised to handle simultaneous packaging of multiple device dies.

However, the drawback of the plate-connection package is its cost and need for non-standard tooling to attach the plates and the plates themselves must be customized to the package and die. Also, this is a post-wafer, packaging-level process dealing with already separated dies, which implies much higher cost compared to an otherwise wafer-level process. In conclusion, there exists a need of major reduction of device packaging related parasitic impedance with a high-performance/low cost package that is compatible with the standard wafer-level process and that requires no non-standard tooling.

SUMMARY OF THE INVENTION

A solder-top enhanced semiconductor device is proposed for packaging with low parasitic impedance. The solder-top enhanced semiconductor device includes:

A semiconductor device die with a top metal layer for interconnecting a number of its active terminals to its operating environment. The top metal layer is patterned into contact zones and contact enhancement zones. The device die includes a pre-windowed top passivation layer through which the top metal layer gets connected to the interior device structure. At least one contact zone is electrically connected, through the on-die interconnections or interior structure of the device die, to at least one of the contact enhancement zones. Atop each contact enhancement zone is added a solder layer for an increased composite thickness thus a correspondingly lowered parasitic resistance and inductance against a lateral surface current flow. In this way, the undesirable parasitic impedance attributable to the semiconductor device die is reduced.

In one embodiment, the solder layer is made of Lead solder, Lead-free solder, Tin-Silver-Copper solder, Tin-Silver solder or Tin-Copper solder. The corresponding top metal layer is made of Copper forming a direct contact with the solder layer.

For those semiconductor device dies whose top metal layer material is incapable of forming a spatially uniform electrical bond directly with the solder layer material due to material incompatibility, the semiconductor device die further includes an intermediary layer that is solderable and conductive. The intermediary layer is sandwiched between and forming a spatially uniform electrical solder bond with the top metal layer and the solder layer. The contact enhancement zones can be further patterned to increase the spatial uniformity of the corresponding electrical solder bond.

In another embodiment, the top metal layer is made of Aluminum. Correspondingly, the intermediary layer can be made of Nickel/Gold layers, Nickel/Palladium layers or Nickel/Palladium/Gold layers allowing an indirect contact between the solder layer and the Aluminum.

In a more specific embodiment, the thickness of the intermediary layer can be from about 2 microns to about 20 microns.

A method for making such solder-top enhanced semiconductor devices includes:

a) During the fabrication of the semiconductor device die insuring that each contact enhancement zone is electrically connected to at least one contact zone through the interior device structure of the semiconductor device die.

b) Lithographically patterning the top metal layer into the contact zones and the contact enhancement zones. This patterning further involves opening windows through a top passivation layer of the semiconductor device die then, through these windows, connecting the top metal layer to the interior device structure of the semiconductor device die.

c) Forming a solder layer atop each of the contact enhancement zones for an increased composite thickness.

In one embodiment, the method for making such solder-top enhanced semiconductor devices further includes carrying out all of steps a), b) and c) at wafer-level before die separation to reduce related device handling and device manufacturing cost. After step c), the semiconductor device dies so fabricated are then separated from their wafer followed by interconnecting, for each individual semiconductor device die, the contact zones to their corresponding active terminals.

In another embodiment, for those semiconductor device dies having an intermediary layer, the method further involves depositing an solderable and conductive intermediary layer sandwiched between and forming a spatially uniform electrical solder bond with the top metal layer and the solder layer.

Where the intermediary layer comprises a thin gold (Au) layer over a Nickel (Ni) layer and the top metal layer is Aluminum, depositing the intermediary layer further involves electro-less plating of the Nickel/Gold layers over the Aluminum. Where the intermediary layer comprises Nickel/Palladium/Gold layers and the top metal layer is Aluminum, depositing the intermediary layer further involves either electro-less or electrolytic plating of the Nickel/Palladium/Gold layers over the Aluminum.

In one embodiment, forming a solder layer atop each of the contact enhancement zones further involves the following wafer-level steps:

c1) Masking the top surface of the semiconductor device dies to reveal each of the contact enhancement zones, locating, then dropping a number of solder-balls thereon with a stencil process.

c2) Annealing the number of solder-balls to make them stick to the surface of each contact enhancement zone.

c3) Heating to melt and flow the number of solder-balls together to spread the solder forming the desired solder layer atop each contact enhancement zone to reduce the resistance over the entire exposed area.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIGS. 3A to 3C are perspective view and cross sectional views of a prior art plate bonding package;

FIG. 4 illustrates the raw concept of the present invention with an irregular-shaped reflow solder bump added atop a semiconductor device test die;

FIG. 5A and FIG. 5B illustrate a refined concept of the present invention, as applied to a VDMOS power MOSFET device, by adding an intermediary layer atop the die metallization then dropping a number of solder balls atop the intermediary layer followed by reflowing the solder balls to form a desired uniform melted solder layer;

FIG. 6 illustrates the first portion of the same refined concept of the present invention as applied to an LDMOS power MOSFET device;

FIG. 7 illustrates the first portion of the same refined concept of the present invention as applied to a VDMOS power MOSFET device again except with a variation of the shape of the intermediary layer;

FIG. 8A through FIG. 8D illustrate the wafer-level portion of manufacturing steps using the present invention; and FIG. 8E through FIG. 8H illustrate the post wafer-level portion of manufacturing steps using the present invention.

DETAILED DESCRIPTION OF SPECIFIC EMBODIMENTS

Figure 1:
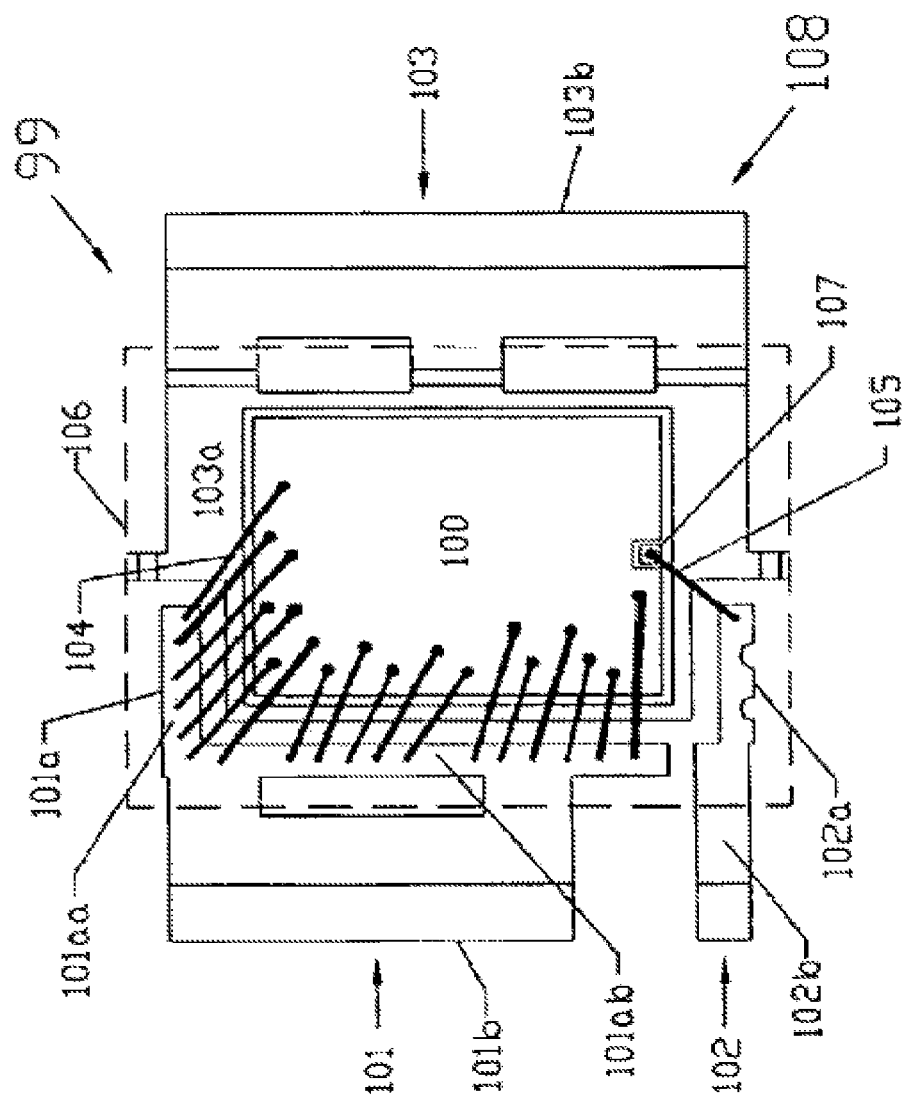
FIGS. 1 and 2 are prior art of traditional bonding wire packages.
Figure 2:
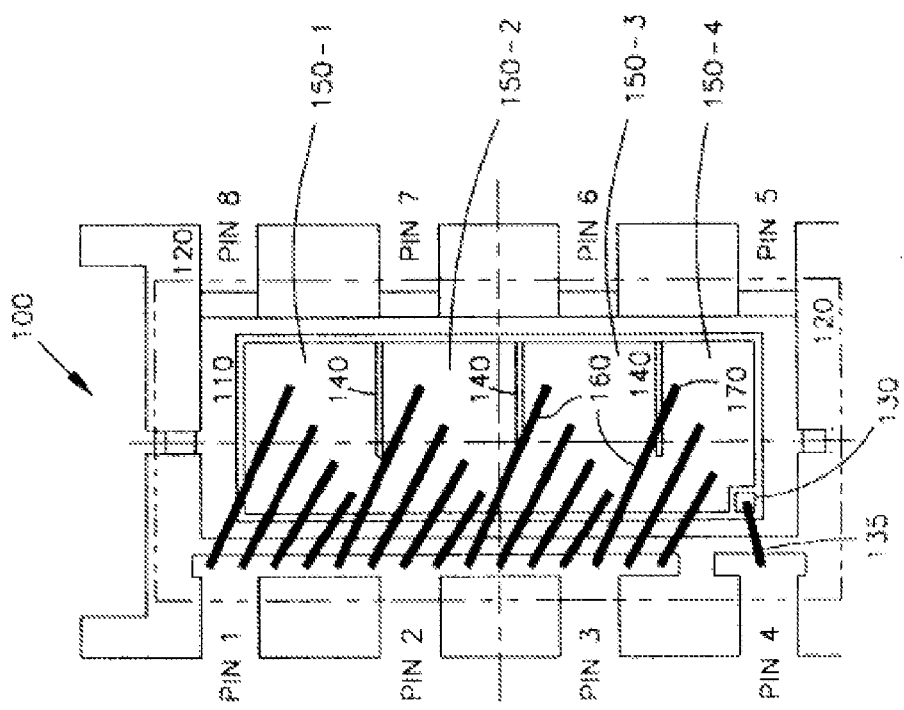
Figure 3A:
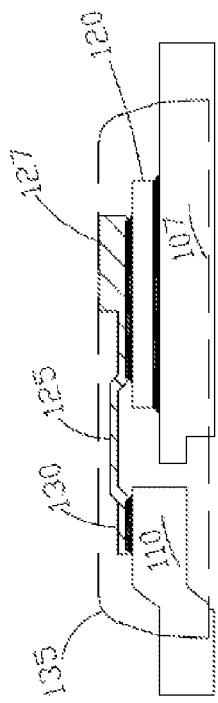
Figure 3A:
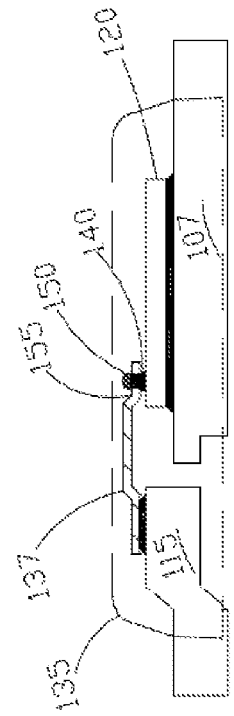
Figure 3A:
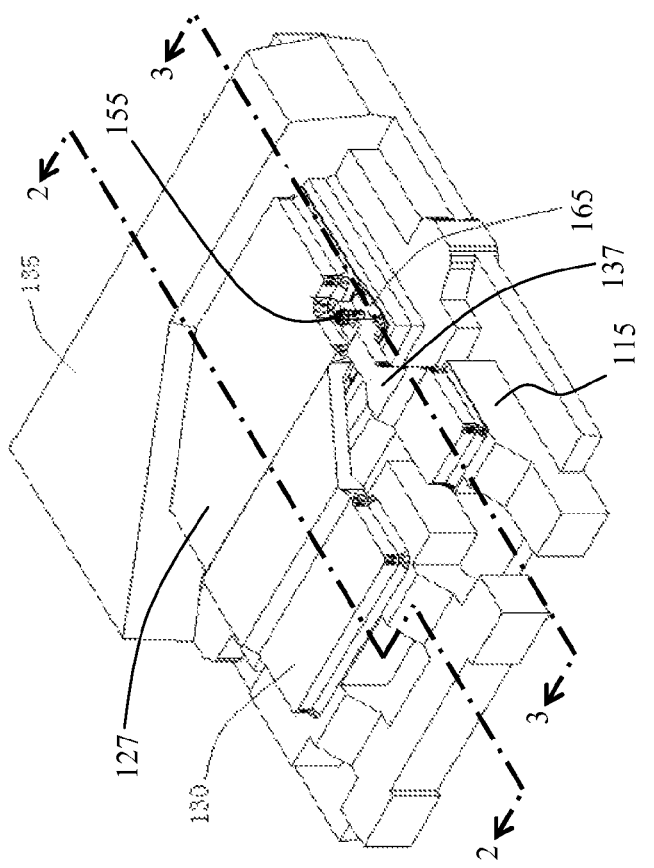

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

FIG. 4 illustrates the raw concept of the present invention with an IC package 200 where an irregular-shaped reflow solder 224 is added atop a VDMOS (Vertical double-diffused Metal-Oxide-Semiconductor) die 202. The solder material can be made of Lead solder, Lead-free solder, Tin-Silver-Copper solder, Tin-Silver solder or Tin-Copper solder. The bottom of the VDMOS die 202, being its drain, is attached to a leadframe die pad 208 with extended drain leadframe terminals 209 and drain leadframe terminals 210 for connection to the outside circuit. Additional leadframe parts are source leadframe sections 212a-212c connected to source leadframe terminals 214 and a gate leadframe section 216 connected to a gate leadframe terminal 218 for the same purpose. The top metal layer of the VDMOS die 202 has a gate contact area 206 and source contact areas 204 both made of the standard material Aluminum. For bridging the top metal layer to the leadframe, a gate bond wire 222 is provided to connect the gate contact area 206 and the gate leadframe section 216. However, a number of source bond wires 205 are provided, considering the high current level there through, to connect the source contact area 204 and the source leadframe sections 212a-212c. To further shorten the source bond wires 205 for a reduced parasitic impedance, the source bond wires 205 are divided into source bond wire group 220a, source bond wire group 220b and source bond wire group 220c. Source bond wires 205 can be made of Gold, Copper, or Aluminum, or instead of being wires, "ribbons" of aluminum. Further source bond wires 205 may be replaced by a metal plate to furnish the connections between source and source lead with source leadframe sections 212a-212c fused together.

As the thickness of the irregular-shaped reflow solder 224 can be made much thicker than the top metal layer of the VDMOS test die 202, the parasitic impedance attributable to an otherwise lateral surface current flow through the source contact area 204 is accordingly much reduced. Furthermore, the very presence of the irregular-shaped reflow solder 224, properly sized, shaped and located on the VDMOS test die 202, allows additional shortening of the gate bond wire 222 and the source bond wires 205 as they only need to reach the edge of the VDMOS die 202 nearest to the gate leadframe section 216 and source leadframe sections 212a-212c. This results in an additional reduction of parasitic impedance attributable to the bond wires without having to reduce the die size. While the IC package 200 does exhibit a problem of the reflow solder 224 being irregular-shaped causing variation in resultant resistance from a non-masked, random flow of the solder, its root cause is understood to be the incompatibility between the solder material and Aluminum in so far as directly forming a spatially uniform, electrical bond between the two is concerned. A second, nevertheless related problem is the inability to maintain a minimum required clearance between the irregular-shaped reflow solder 224 and the contact zones, where the various source bond wires 205 contact the source contact area 204. Such a minimum required clearance must be maintained to insure that the irregular-shaped reflow solder 224 does not extend too far to mechanically interfere with a wire bonding process for interconnecting these bond wires causing process unreliability. Even though the solder layer 224 may be applied after the wire bonding process, a minimum clearance is still required as upon contacting a bond wire, the reflow solder may attack it chemically causing long term unreliability. The solution of these problems of the IC package 200 while maintaining the reduction of parasitic impedance will be presently described.

FIG. 5A and FIG. 5B illustrate a refined concept of the present invention, as applied to a VDMOS type of power MOSFET device of FIG. 4, by adding an intermediary layer atop the die metallization then dropping a number of solder balls 304 atop the intermediary layer followed by reflowing the solder balls 304 to form a desired uniform melted solder layer 304a. The bottom of the power device die 300, being its drain, is attached to a leadframe 310 whose extended drain leadframe terminals for connection to the outside circuit are not shown here to avoid obscuring details. Additional simplified leadframe parts are source leads 306 and a gate lead 308. While not directly shown here, the top metal layer of the power device die 300 is again made of the standard material Aluminum. The top metal layer is patterned into three zones with the top of each zone having a Nickel/Gold (Ni/Au) intermediary layer plated thereon with an electro-less plating process, forming a Ni/Au plated pad opening atop metallization 302a, a Ni/Au plated pad opening atop metallization 302b and a Ni/Au plated pad opening atop metallization 302c. The plated Ni/Au layer of Ni/Au plated pad openings 302a, 302b and 302c constitutes the intermediary layer. To those skilled in the art, the Ni/Au plated pad opening 302a, in this case, should be understood to be in direct contact with a top metal layer portion beneath that in turn is connected to the source of the power VDMOS device die 300 through a pre-windowed top passivation layer. As the Ni/Au plated pad opening 302b is intended to be connected to the source leads 306 with a source bond wire group 220c, the top metal layer beneath the Ni/Au plated pad opening 302b is electrically connected, as part of the power device die 300 structure, to that beneath the Ni/Au plated pad opening 302a. To those skilled in the art, the Ni/Au plated pad opening 302c, in this case, should be understood to be in direct contact with another top metal layer portion beneath that in turn is connected to the gate of the power VDMOS device die 300 through a pre-windowed top passivation layer. The Ni/Au plated pad opening 302c is intended to be connected to the gate lead 308 with a gate bond wire 222.

The Ni/Au plated intermediary layer is conductive, solderable and capable of metallurgically forming a spatially uniform electrical solder bond with the Aluminum top metal layer and the solder material. Hence, as is illustrated in FIG. 5B, upon melting and reflow, the solder balls 304 turn into a uniform melted solder layer 304a in electrical contact with the Aluminum top metal layer via the Ni/Au plated intermediary layer. Furthermore, with the electro-less plating process the thickness of the Ni/Au plated intermediary layer can be made from about 2 microns to about 20 microns comprising a thick Ni layer and a thin Au layer, much thicker than the typical top metal layer that is from about 0.5 microns to about 5 microns. If necessary, the electro-less plated Ni/Au intermediary layer can possibly be made even thicker depending upon the plating process rate, exposed plating area and resultant layer stress, etc. Therefore, the uniform melted solder layer 304a atop the top metal layer effects a much increased composite conductor thickness with a correspondingly lowered parasitic impedance, including both parasitic resistance and parasitic inductance components attributable to the power device die 300, against a surface current flow through it. Notice that the uniform melted solder layer 304a will only flow in the exposed Ni/Au plated pad opening 302a areas to effectively form a low resistance and low stress thick source metallization. This can further reduce the source metal on top of the power device die 300 by increasing the effective metal thickness in a self-aligned fashion (using the exposed top metal through a pad mask). By the same token, the uniform melted solder layer 304a is guaranteed to separate from the Ni/Au plated pad openings 302b and 302c by a minimum required clearance for reliable wire bonding as well. In practice, the minimum required clearance is determined to be in the range of 100-150 micron. Functionally speaking, the patterned top metal layer zone beneath the Ni/Au plated pad opening 302a can be characterized as a contact enhancement zone under the present invention. Whereas, the patterned top metal layer zones beneath the Ni/Au plated pad opening 302b and the Ni/Au plated pad opening 302c can be characterized as traditional contact zones. For bridging the top metal layer to the leadframe, a gate bond wire 222 is provided to connect the Ni/Au plated pad opening 302c and the gate lead 308. However, a source bond wire group 220c is used, considering the high current level there through, to connect the Ni/Au plated pad opening 302b and the source leads 306. Bond wires can be made of Gold, Copper or Aluminum, with sizes in the 25 to 200 micron range. Additionally, Aluminum ribbons can be used depending on the package configuration. By now it should become clear that electro-less plated Ni/Au is not the only material usable for the intermediary layer. Any alternative material that is conductive, solderable and capable of metallurgically forming a spatially uniform electrical solder bond with the Aluminum top metal layer and the solder material will do under the present invention. The following lists a few examples of such alternative material:

Nickel/Gold (Ni/Au) layers, Nickel/Palladium (Ni/Pd) layers, Nickel/Palladium/Gold (Ni/Pd/Au) layers.

As another important side remark, for those power semiconductor devices whose top metal layer material, such as Copper (Cu), can already form a spatially uniform, electrical bond directly with the solder layer material upon its melting, it would not be necessary to add the aforementioned intermediary layer atop the top metal layer before dropping the solder balls 304 thereon.

FIG. 6 illustrates the first portion of the same refined concept of the present invention as applied to an LDMOS (Lateral Double-diffused Metal-Oxide-Semiconductor) power MOSFET device die 300. The embodiment is the same as that illustrated in FIG. 5A except:

The bottom surface of the power MOSFET device die 300 is its source and the top surface of the power device die 300 contains its drain with the Ni/Au plated pad opening 302b and gate with the Ni/Au plated pad opening 302c. The Ni/Au plated pad openings 302b and 302c are connected respectively to drain leads 312 and gate lead 308 of the leadframe 310 with drain bond wire group 226c and gate bond wire 222.

FIG. 7 illustrates the first portion of the same refined concept of the present invention as applied to a VDMOS power MOSFET device die 300 again, except with a variation of the shape of the Ni/Au plated pad opening 302a accompanied by a corresponding asymmetric placement of the solder balls 304. This freedom of shape variation of the Ni/Au plated pad opening 302a can be quite significant as the following process of solder ball melting and reflow, being dependent upon the specific pad opening shape, can empirically result in a melted solder layer 304a of varying degrees of uniformity. Hence, in practice, a variety of pad opening shapes, such as a cross, a star, a grid, an interdigitated set of fingers and a helix, should be experimented with until the best spatial uniformity of the corresponding melted solder layer 304a is found with minimum material stress and resistance. By now it should become clear that numerous additional parameters under the present invention can be adjusted as well to further optimize the reduction of parasitic packaging-related impedance attributable to the power device die 300. Some parameter examples are listed below:

Number and size of the solder balls 304.

Employing an additional mask to pattern the Ni/Au plated pad opening 302a independently of the underlying device metal electrode pattern.

Depending upon the die attach temperature, solder melting and reflow within the Ni/Au plated pad opening 302a could be combined with the die attaching process.

The distance between the Ni/Au plated pad opening 302a and the bond-pad region can be fine tuned to reduce the overall size of the packaged power device die 300.

FIG. 8A through FIG. 8D illustrate the wafer-level portion of manufacturing steps using the present invention with correspondingly reduced device manufacturing cost due to economy of scale. In FIG. 8A is illustrated the wafer-level device fabrication of eight power VDMOS device sites 300a-300h up to and including the patterning of their top metal layer into numerous exposed Al-metallization through pad openings 314 for interconnection. As is known in the art of semiconductor device fabrication, patterning the top metal layer involves lithographically opening numerous windows through a top passivation layer of the semiconductor device wafer then, through these windows, evaporating and/or connecting the top metal layer, typically Aluminum, to the interior device structure of the semiconductor device die.

FIG. 8B illustrates the result following a next electro-less wafer plating process through which an intermediary thick layer of Ni/Au is effectively deposited onto the numerous exposed Al-metallization through pad openings 314 forming a corresponding number of Ni/Au plated pad opening 302a, Ni/Au plated pad opening 302b and Ni/Au plated pad opening 302c. While not specifically shown, the Ni/Au plated pad opening 302b is electrically connected through the interior device die structure to the Ni/Au plated pad opening 302a. Recall that the Ni/Au plated pad opening 302a corresponds to a contact enhancement zone while the Ni/Au plated pad opening 302b and the Ni/Au plated pad opening 302c correspond to contact zones under the present invention.

Next, using a stencil process (CSP) the wafer is masked to reveal each of the Ni/Au plated pad openings atop metallization 302a (corresponding to the contact enhancement zones), locate then drop numerous solder balls 304 onto the Ni/Au plated pad opening 302a. Subsequently, the wafer is annealed to make the solder balls 304 stick to the exposed metal surfaces. The result is illustrated in FIG. 8C.

Next, the wafer is mounted on a dicing tape then separated into individual power device dies using a standard wafer dicing process. The resulting power device dies 300 and dicing streaks 316 are illustrated in FIG. 8D. To those skilled in the art, by now it should become clear that, while the current illustration is limited to a case of eight power device sites 300a-300h, the present invention method would equally apply to a wafer scale manufacturing environment with thousands of device sites thereon. Furthermore, the present invention is not limited to the packaging of power semiconductor device either.

FIG. 8E through FIG. 8H illustrate the post wafer-level portion of manufacturing steps using the present invention. In FIG. 8E, an individual power device die 300, together with its stuck solder balls 304, is attached to a leadframe 310. FIG. 8F illustrates the result of an optional reflow process wherein the attached power device die 300 is further heated to melt and flow the solder balls 304 together to form a uniform melted low-resistance solder layer 304a atop the Ni/Au plated pad opening 302a (corresponding to a contact enhancement zone). The net effect is an increased composite thickness with a correspondingly lowered parasitic resistance and parasitic inductance components. This step is optional as, if the die attach heating cycle preceding FIG. 8E was sufficient to form the uniform melted solder layer 304a, then the reflow process would not be necessary.

FIG. 8G illustrates the result of a wire bonding process wherein the Ni/Au plated pad opening 302b and the Ni/Au plated pad opening 302c (the contact zones) are respectively connected to the leadframe 310 with a bond wire group 318 and a bond wire 320. To maintain a minimum spacing between the uniform melted solder layer 304a (the contact enhancement zone) and its nearest numerous bond wires for reliability it would be a simple matter of correspondingly spacing the Ni/Au plated pad opening 302a from both the Ni/Au plated pad opening 302b and the Ni/Au plated pad opening 302c with a proper pad pattern design.

Finally, FIG. 8H illustrates a completely packaged power device die 300 with a partially broken molded plastic seal 322 to reveal some of the packaging related parts. Briefly, the operation involves molding the molded plastic seal 322, plating the leadframe leads, marking the package exterior for identification, trimming and forming the leads then finally testing the packaged device.

While the description above contains many specificities, these specificities should not be constructed as accordingly limiting the scope of the present invention but as merely providing illustrations of numerous presently preferred embodiments of this invention. For example, with only adjustment of numerous geometrical dimensions, the present invention can be modified to package numerous other types of semiconductor devices with other types of packaging as well.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

We claim:

1. A method for reducing an undesirable parasitic impedance, attributable to a fabricated semiconductor device die having a top metal layer for interconnecting a number of its active terminals to its operating environment, the method comprises:
   step (a) patterning the top metal layer into a first plurality of contact zones and a second plurality of contact enhancement zones;
   step (b) electrically connecting at least one contact zone, through the interior device structure of the fabricated semiconductor device die, to at least one of the contact enhancement zones; and
   step (c) for each of said contact enhancement zones, attaching a solder layer atop it, the top surface of the solder layer being free of any electrical connection, for an increased composite thickness thus a correspondingly lowered parasitic impedance, including parasitic resistance and parasitic inductance components, against a surface current flow there through
   whereby reduce the undesirable parasitic impedance, attributable to the fabricated semiconductor device die, through said at least one contact zone.

2. The method for reducing an undesirable parasitic impedance of claim 1 further comprises carrying out all of steps (a), step (b) and step (c) at wafer-level before die separation from a wafer whereby reduce device handling and device manufacturing cost of the fabricated semiconductor device die.

3. The method for reducing an undesirable parasitic impedance of claim 2 further comprises:
   separating, from the wafer, each fabricated semiconductor device die there from and interconnecting the first plurality of contact zones to their corresponding active terminals.

4. The method for reducing an undesirable parasitic impedance of claim 3 wherein interconnecting the first plurality of contact zones to their corresponding active terminal further comprises maintaining the spacing between any contact zone and its nearest contact enhancement zones to be at least at a pre-determined minimum spacing to insure reliability of the interconnecting process.

5. The method for reducing an undesirable parasitic impedance of claim 1 wherein patterning the top metal layer further comprises opening a plurality of windows through a top passivation layer of the fabricated semiconductor device die then, through said plurality of windows, connecting the top metal layer to the interior device structure of the fabricated semiconductor device die.

6. The method for reducing an undesirable parasitic impedance of claim 1 wherein attaching a solder layer further comprises providing a solder layer material that is made of Lead solder, Lead-free solder, Tin-Silver-Copper solder, Tin-Silver solder or Tin-Copper solder.

7. The method for reducing an undesirable parasitic impedance of claim 6 wherein, for a top metal layer material incapable of forming a spatially uniform, electrical bond directly with the solder layer material due to material incompatibility, attaching the solder layer further comprises depositing an intermediary layer, being solderable and conductive, sandwiched between and forming a spatially uniform electrical solder bond with the top metal layer and the solder layer.

8. The method for reducing an undesirable parasitic impedance of claim 7 wherein patterning the top metal layer into the first plurality of contact zones and the second plurality of contact enhancement zones further comprises patterning at least one of said contact enhancement zones to further increase the spatial uniformity of the corresponding electrical solder bond.

9. The method for reducing an undesirable parasitic impedance of claim 6 wherein said top metal layer is made of Copper and attaching the solder layer atop each of said contact enhancement zones further comprises making a direct contact between the solder layer and the top metal layer.

10. The method for reducing an undesirable parasitic impedance of claim 7 wherein the pair of (top metal layer, intermediary layer) further includes (Aluminum, Nickel/Gold layers), (Aluminum, Nickel/Palladium layers) and (Aluminum, Nickel/Palladium/Gold layers).

11. The method for reducing an undesirable parasitic impedance of claim 10 wherein, where the pair (top metal layer, intermediary layer) is (Aluminum, Nickel/Gold layers), depositing the intermediary layer further comprises electro-less plating of the Nickel/Gold layers over the Aluminum.

12. The method for reducing an undesirable parasitic impedance of claim 10 wherein, where the pair (top metal layer, intermediary layer) is (Aluminum, Nickel/Palladium/Gold layers) depositing the intermediary layer further comprises electro-less plating of the Nickel/Palladium/Gold layers over the Aluminum.

13. The method for reducing an undesirable parasitic impedance of claim 10 wherein, where the pair (top metal layer, intermediary layer) is (Aluminum, Nickel/Palladium/Gold layers) depositing the intermediary layer further comprises electrolytic plating of the Nickel/Palladium/Gold layers over the Aluminum.

14. The method for reducing an undesirable parasitic impedance of claim 1 wherein attaching a solder layer atop each of said contact enhancement zones further comprises:
- step (c1) masking to reveal each of said contact enhancement zones, locating, then dropping a plurality of solder-balls thereon with a stencil process;
- step (c2) annealing the plurality of solder-balls to make them stuck atop the surface of each of said contact enhancement zones;
- step (c3) heating to melt and flow the plurality of solder-balls together to form a solder layer atop each of said contact enhancement zones.

* * * * *